United States Patent [19]

Burke

[11] Patent Number: 5,423,475
[45] Date of Patent: Jun. 13, 1995

[54] DIAMOND COATINGS FOR ALUMINUM ALLOYS

[75] Inventor: Michael A. Burke, Pittsburgh, Pa.

[73] Assignee: Westinghouse Electric Corporation, Pittsburgh, Pa.

[21] Appl. No.: 132,258

[22] Filed: Oct. 6, 1993

[51] Int. Cl.⁶ .................. B23K 20/00; B05D 3/06
[52] U.S. Cl. ............................. 228/193; 427/577; 427/575; 427/249; 427/122; 423/446
[58] Field of Search .......... 427/577, 575, 249, 122; 156/637, DIG. 68; 228/193; 437/974; 423/446; 428/408

[56] References Cited

U.S. PATENT DOCUMENTS

| | | | |
|---|---|---|---|
| 4,301,592 | 11/1981 | Lin | 29/590 |
| 4,734,339 | 3/1988 | Schachner et al. | |
| 4,849,290 | 7/1989 | Fujimori et al. | |
| 5,183,529 | 2/1993 | Potter et al. | 156/613 |
| 5,227,313 | 7/1993 | Gluck et al. | 437/2 |
| 5,272,104 | 12/1993 | Schrantz et al. | 437/63 |

FOREIGN PATENT DOCUMENTS 63-252997 10/1988 Japan .
01-244707 9/1989 Japan .

OTHER PUBLICATIONS

Jin et al, "Properties of optically smooth diamond thin films produced by ECR-PACVD," SPIE, vol. 1759 (1992) pp. 116-122.

W. D. Partlow, R. E. Witkowski and J. P. McHugh: *CVD Diamond Coatings for the Infrared by Optical Brazing* pp. 163-168 in "Applications of Diamond Films and Related Materials" ed. Y. Tzeng, M. Yoshikawa, M. Murakawa and A. Feldman, Elsevier Science Publishers B. V., 1991.

*Primary Examiner*—Roy V. King

[57] ABSTRACT

An aluminum body having diamond bonded thereto with a diffused interlayer of silicon is described.

6 Claims, 1 Drawing Sheet

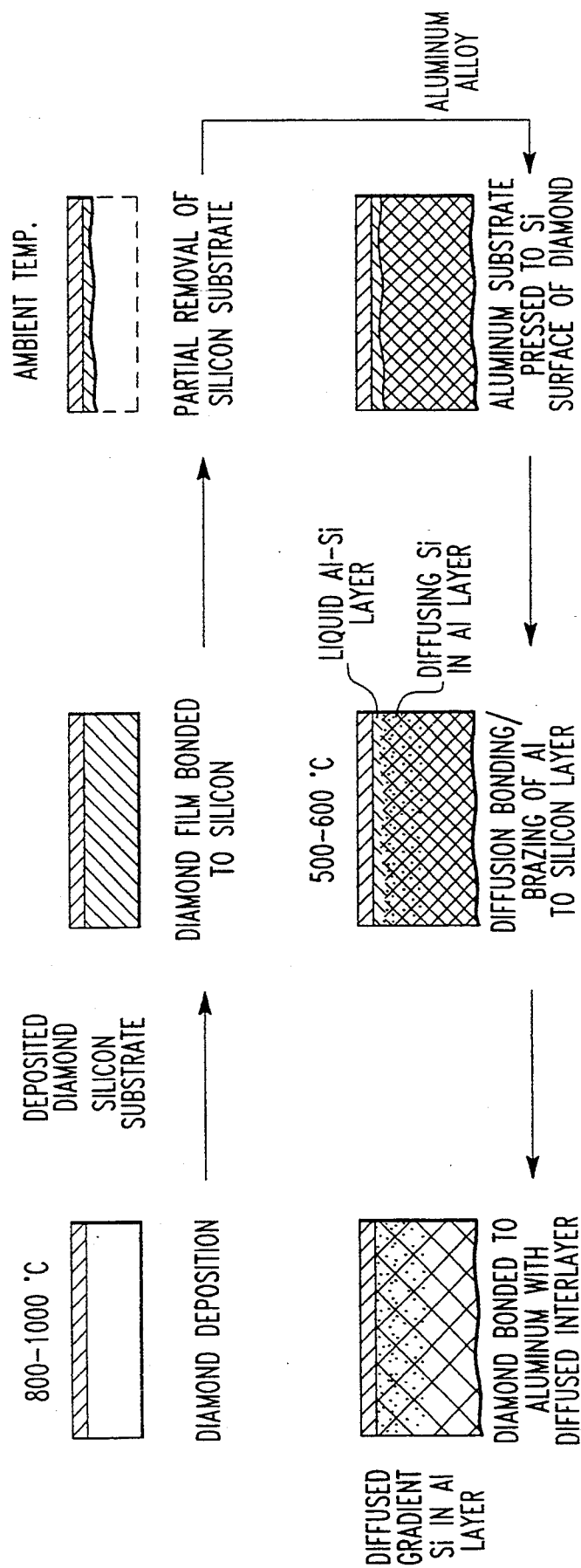

DIAMOND COATINGS FOR ALUMINUM ALLOYS

BACKGROUND OF THE INVENTION

The present invention relates to a composition of matter and more particularly it relates to a substrate of aluminum, e.g., metal or aluminum alloy on the surface of which is bonded a film of diamond. The present invention also includes within its scope a process for bonding diamond onto such a substrate.

Diamond coatings of aluminum alloys are attractive for several mechanical and electronic applications. The mechanical advantages of diamond surface coatings include for example improve wear or abrasion resistance and in some instances erosion resistance. The electronic applications of these diamond coated bodies rely on the excellent thermal conductivity and high electrical resistance of the diamond. The production of these hybrid systems exhibiting good bonding, however requires good processes.

The critical technological issue that currently frustrates the production of such diamond films on aluminum substrate is that good quality diamond films can only be grown on substrates that are heated between 800° and 1000° C. Since aluminum alloys melt at about 600°–700° C., aluminum alloy substrates cannot be employed to support the growth of good quality diamond films. The process to apply diamond films to aluminum or aluminum alloys must involve means of growing the film at high temperature and then providing a means for bonding the film to the aluminum substrate by a method that yields a good metallurgical bond.

Diamond films can be grown on silicon substrates. The growth can be either by microwave or plasma means but a critical parameter for good film growth is the temperature of the substrate upon which the film is to be deposited. Generally speaking, control of the substrate temperature in a range of 800°–1000° C. is needed to ensure high quality diamond films. Films that are grown under these conditions can be stripped of their silicon substrates by chemical etching and subsequently applied to coat other materials.

DESCRIPTION OF PRIOR ART

U.S. Pat. No. 4,734,339 discloses a deposition process for making a compound body with many small diamond particles bonding to each other by another medium that is deposited during the interrupted process of depositing the diamond particles. The bonding medium is a noble metal or a ceramic nitride oxide and the like. The body is built up from multiple depositions of these systems. U.S. Pat. No. 4,849,290 describes a deposition process for coating alumina for the vapor phase growth of deposition. This reference does also not teach the use of silicon as a bonding medium.

SUMMARY OF THE INVENTION

In accordance with the present invention, there is provided a process for applying diamond coatings to a metallic body, i.e. aluminum metal or metal matrix composite articles. Briefly, diamond films are grown on silicon substrates under high temperature conditions. The silicon substrate is subsequently thinned at room temperature. The thus thinned silicon layer is bonded by diffusion or brazing to the surfaces of the article to be coated, i.e. the aluminum body. The resulting structure exhibits excellent metallurgical bonding between the diamond film and the aluminum body which is enriched in silicon near the bond interface.

The present invention includes within its scope the body thus produced. Such a body has many useful applications. These applications include, for example, turbine compressor blading and electronic packaging.

BRIEF DESCRIPTION OF THE FIGURE

The sole FIGURE illustrates schematically a typical process for applying diamond coatings to an aluminum alloy.

DETAILED DESCRIPTION OF THE INVENTION

According to present invention, there is provided a process for applying diamond coatings onto substrates such as metallic aluminum or aluminum alloys. In the first step according to the present invention, diamond is deposited by conventional methods onto a silicon substrate. The substrate is subsequently thinned to a reduced thickness and is then bonded by diffusion to the surface of the selected substrate. Please see for example; W. D. Partlow, R. E. Witkowski and J. P. McHugh: "*CVD Diamond Coatings for the Infrared by Optical Brazing.*" pp 163-168 in "Applications of Diamond Films and Related Materials" ed Y. Tzeng, M. Yoshikawa, M. Murakawa and A. Feldman, Elsevier Science Publishers B. V., 1991.

In a typical practice, the deposit of diamond thin films utilize a conventional deposition process. Thus, for example, a thin film with diamond is deposited onto the surface of a clean substrate comprising silicon at high temperature such as between 800°–1000° C. by either microwave or plasma deposition. The silicon substrate is an excellent substrate for receiving the deposit of diamond film. That is to say, the diamond film is well bonded to the silicon substrate. The silicon is then removed from the back of the diamond film by chemical etching to produce a film of diamond. According to present invention, the etching is controlled to only partially remove the silicon so that a very thin layer of silicon remains which adheres to the diamond film. Thus, after the diamond deposited on silicon film has been cooled to room temperature, the silicon substrate is chemically thinned, e.g., using a solvent that dissolves Si such as hydrogen fluoride (HF). The thinning process is carefully controlled so that at the end of the process, a controlled thin film in the range of 1 to 500 microns remains bonded to the diamond film. The hybrid diamond layer/thin silicon layer is then used in the second step, i.e., for bonding to the surface of the substrate.

The resulting structures can be controlled to mix the aluminum and silicon up to the metallurgical interface between the diamond and the silicon. The resulting structure is effectively that of a deposited diamond layer over an aluminum body that has a silicon-enriched layer near the diamond interface. In a preferred embodiment the foregoing process is illustrated in the figure. As will become apparent from the figure, in the first step, diamond is deposited onto a silicon substrate at a temperature of between about 800°–1000° C. The diamond coated silicon is then treated at ambient temperature to effect a partial removal of silicon substrate.

In the next step, the diamond coated silicon body is pressed onto the aluminum substrate. The resulting body is heated at between 500°–600° C. to produce the desired body according to the present invention.

The aluminum layer to which the diamond-silicon layer is to be bonded is prepared for bonding in a similar manner to that conventionally employed for brazing or diffusion bonding. The surface layer of the alloy must be clean and, particularly if diffusion bonding is to be employed, oxide free. The silicon face of the diamond silicon film is placed in contact with the aluminum. Pressure may be applied to the silicon-aluminum interface in order to enhance bonding.

Bonding should be conducted in an inert atmosphere or in a vacuum. The temperature of the system is raised to the region near the Al-Si eutectic melting temperature. Diffusion bonding employs a temperature just below the eutectic melting temperature. Brazing employs a temperature just above the eutectic melting temperature. The elevated temperature is applied for a sufficient time to allow the bonding and interdiffusion to occur and then the system is cooled to room temperature.

As described above, good diamond films can be grown on silicon substrates. Diamond film growth is by a conventional procedure such as by microwave or plasma means but a critical parameter for good film growth is a temperature of the substrate about which the film is to be deposited. Consequently, control of the substrate temperature is important i.e. in a range of about 800°–1000° C. to ensure high quality diamond films.

Brazing and diffusion bonding can be effectively accomplished using a thin film of either a silicon rich or an aluminum rich layer. When a thin film of bond material is used, the intermixing of the aluminum and silicon materials is restricted by the limited supply of the thin layer. In the case of brazing aluminum materials using a thin layer of silicon rich material, diffusion of the silicon into the aluminum in the regions that have compositions that are leaner than the eutectic composition results in a eutectic region being depleted in silicon and, thereby, increasing the local melting temperature. Diffusion bonding produces the same effects as brazing.

Joining of aluminum substrates to silicon coated diamond films may be accomplished by diffusion bonding or brazing. Controlling the thickness of the silicon that remains attached to the diamond film will allow for controlled intermixing of the silicon and aluminum. Control of the thickness of the silicon layer can be accomplished by controlled chemical etching of the silicon after diamond film has been deposited. Controlled diffusion bonding or brazing of the diamond silicon material to an aluminum substrate produces a well adhered diamond-aluminum alloy structure.

Among the many uses of the diamond coated aluminum alloy of this invention are compressor turbine blades, having improved erosion resistance.

The application of erosion resistant diamond coatings on aluminum blades would allow their use in turbine compressors. Currently, in order to withstand the erosion problems, compressor blades must be made of steel or titanium. The use of aluminum would alleviate weight and mechanical design problems.

Thin diamond films can also be used as "heat spreaders" placed between semiconductor chips and electronic module packages. In these applications the excellent thermal conductivity is used to laterally dissipate heat away from a local hot spot in the chip. Since many electronic packages for high density electronics are fabricated from low expansion metals or metal matrix composites, the ability to bond the diamond film to aluminum will greatly improve the effectiveness of such packages.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

I claim:

1. A process for producing a diamond coated metallic body which comprises:
    a) depositing a film of diamond onto a silicon substrate;
    b) thinning the silicon substrate;
    c) pressing an aluminum substrate against said silicon substrate and
    d) heating the aluminum substrate and silicon substrate to a temperature of about 500°–600° C. to effect bonding of said silicon to said aluminum substrate.

2. A process according to claim 1 wherein said diamond is deposited by microwave plasma deposition.

3. A process according to claim 1 wherein said diamond is deposited by plasma deposition.

4. A process according to claim 1 wherein said diamond deposition is effected at a temperature of between 800° to about 1000° C.

5. A process according to claim 1 wherein the thinning of silicon is effected by treating the structure obtained in step "a" with hydrogen fluoride.

6. The process of claim 1 wherein the aluminum substrate is one of a turbine blade and an electronic package module.

* * * * *